United States Patent [19]
Rice et al.

[11] Patent Number: 5,437,757
[45] Date of Patent: Aug. 1, 1995

[54] CLAMP RING FOR DOMED PEDESTAL IN WAFER PROCESSING CHAMBER

[75] Inventors: Michael Rice, Pleasanton; Jon Mohn, Saratoga, both of Calif.

[73] Assignee: Applied Materials, Inc., Santa Clara, Calif.

[21] Appl. No.: 184,125

[22] Filed: Jan. 21, 1994

[51] Int. Cl.⁶ ............................................. C23F 1/02
[52] U.S. Cl. .................... 156/345; 118/728; 204/298.15
[58] Field of Search ............... 156/345, 643; 118/729, 118/730, 728, 725; 204/298.11, 298.15

[56] References Cited

U.S. PATENT DOCUMENTS

| | | | |
|---|---|---|---|
| 4,978,412 | 12/1990 | Aoki | 156/345 |
| 5,124,019 | 6/1992 | Kunkel | 204/298.15 |
| 5,203,958 | 4/1993 | Arai | 156/643 |
| 5,268,067 | 12/1993 | Dostalik | 156/643 |
| 5,304,248 | 4/1994 | Cheng | 118/728 |

Primary Examiner—R. Bruce Breneman
Assistant Examiner—Joni Y. Chang
Attorney, Agent, or Firm—Craig P. Opperman

[57] ABSTRACT

A clamp ring for use in a thermal reactor for processing a semiconductor wafer. The reactor includes a domed pedestal for supporting the wafer and controlling its temperature, and a clamp ring which includes an annular seat formed therein, for receiving and holding down the periphery of the wafer onto the domed pedestal. The seat formed in the clamp ring supports a ring of spheres which, in operation, engage and hold down the periphery of the wafer. Each sphere is rotationally supported in a pocket formed in the body of the clamp ring. A portion of each sphere protrudes beyond the seat so that the wafer's surface is contacted by the convex surface of the sphere. This keeps the wafer's surface and any sharp edges on the seat apart, thereby reducing damage of the wafer's surface by the seat. As the spheres are able to rotate in the pockets and therefore roll on the surface of the wafer, the chances of the damaging the wafer's surface are further reduced.

21 Claims, 4 Drawing Sheets

CLAMP RING FOR DOMED PEDESTAL IN WAFER PROCESSING CHAMBER

BACKGROUND OF THE INVENTION

1. Field of the Invention

This invention relates to semiconductor wafer processing reactors and, more particularly, to an improved clamp ring for clamping a semiconductor wafer onto a pedestal used in such processing reactors.

2. Background

Semiconductor wafers are generally processed in thermal reactors in which the wafer is subjected to a number of different processing steps. In certain wafer processes, for example plasma etching and sputtering, the wafer to be processed is held down onto a domed pedestal by a clamping device such as a clamp ring.

An example of how wafers have been mounted in a plasma reactor is illustrated with reference to FIG. 1, which is an exploded sectional view of the relevant internal components of the reactor. This figure shows a semiconductor wafer 10, a circular wafer support 12 on which four (of which only two are shown) lift fingers 16 are mounted, a domed pedestal 18 and a clamp ring 24.

Before wafer processing commences, the semiconductor wafer 10 is brought laterally into the reactor by means of a robot arm (not shown). The wafer support 12 then moves up from below the wafer 10 to lift it clear of the robot arm by supporting it on the flat support faces 14 of the four lift fingers 16. The robot arm then leaves the reactor, and the support 12 moves downward to bring the wafer 10 into contact with the domed upper surface of the pedestal 18. (As is shown in this figure, the support 12 moves along a common central axis 19, indicated in broken lines, which it shares with the pedestal.) Thereafter, the clamp ring 24 moves down onto the wafer so that the wafer 10 is received in a flat faced, annular seat 26 formed in the clamp ring's underside.

The clamp ring 24 continues to move downward, forcing the wafer 10 to adopt approximately the profile of the domed surface of the pedestal 18. It is in this configuration, which is illustrated in greater detail in FIG. 2, that the plasma etching process steps occur.

Before describing FIG. 2 in detail, it should be noted that although not evident from FIGS. 1 or 2, the pedestal 18 has an outer diameter larger than that of the outer diameter of the wafer 10. Furthermore, to enable the support 12 and the fingers 16 to move past the pedestal 18, four cutouts 20 are formed in the sides of the pedestal. Typically, the pedestal 18 is made of aluminum and includes water passages for passing cooled water to cool its domed surface. The pedestal operates to cool the wafer 10 during wafer processing. It can also be electrically charged during plasma etch processes to act as a cathode so as to ensure correct wafer etching. To enhance transfer of heat from the wafer to the domed surface and improve uniformity of this transfer, gas is injected into the space between the wafer and the domed surface via a gas conduit 22, formed along the central axis 19 of the pedestal 18 to exit in the center of the dome.

FIG. 2 is an enlarged detail of the area where the clamp ring 24 engages the edge of the water 10 and illustrates the problem with the prior art clamp rings. As is apparent from this FIGURE, the flat face of seat 26 is horizontal, while the surface of the pedestal, and accordingly the wafer when it conforms to the dome of the pedestal, are curved. As a result, the clamp ring 24 contacts the wafer 10 only in a line at edge 30.

The problem with this arrangement is that the wafer's surface can be damaged by the edge 30 scraping it. Alternatively, if the wafer is much harder than the clamp ring 24, the clamp ring can be damaged by the wafer. Damage to either the wafer or the ring can lead to undesirable particle generation during the processing operations.

This problem is further exacerbated when gas is injected into the gas conduit 22 and forced into the space between the backside of the wafer 10 and the domed surface of pedestal 18. The gas, usually an inert gas such as Helium, is typically maintained at a pressure of between 4 to 18 Torr while the pressure in the interior of the reactor is at 2 to 10 milliTorr during processing. As a result of this pressure differential the wafer flexes and bows away from the pedestal 18, a configuration indicated by broken lines 10'. Not only does this flexing cause even greater pressure on the wafer's surface by the edge 30 of the clamp ring 24, but it also worsens the scraping of the surface of the wafer 10 by the edge 30.

In the past, attempts have been made to overcome this problem by very accurately machining and precision polishing the seat 26 and particularly the right-angled edge 30. This machining and polishing process requires a great deal of care by skilled operators and is therefore very costly. Unfortunately, however, even the most careful polishing and resulting deburring of the right-angled edge 30 is still not sufficient to provide a totally defect-free edge. Any imperfections in this edge 30 act as concentration points for the stress generated by the clamp ring as it holds the wafer down onto the pedestal. These stress concentration points cause damage which can be particularly troublesome as a silicon wafer behaves much like a piece of glass; i.e., a small chip or score mark on the wafer's surface may propagate from the point of stress and shatter the wafer. Additionally, such scoring and marking of the wafer's surface disrupts its planarity. Thus, subsequent processing, for example with a material such as tungsten-CVD (which is difficult to bond to a wafer's surface even under ideal conditions) may not be possible with any measure of reliability as the tungsten may not be able to adhere to the damaged portion of the wafer's surface. As a result, the tungsten may tend to lift away from the wafer's surface during further processing.

Another way of solving this problem has been suggested in U.S. patent application Ser. No. 08/037,988 filed on Mar. 24, 1993 in the names of Banholzer, et al. This application teaches the use of a clamp ring in which the face of the seat is angled upwards at an angle at least as steep as the slope of the domed surface of the pedestal.

Notwithstanding these proposed solutions, there exists a need for a clamping a semiconductor wafer onto a domed pedestal in a thermal reactor.

SUMMARY OF THE INVENTION

The present invention provides an improved clamp ring for use in a thermal reactor for processing a semiconductor wafer. The reactor includes a domed pedestal, for supporting the wafer and controlling its temperature, and a clamp ring which includes an annular seat foraged therein, for receiving and holding down the periphery of the wafer onto the domed pedestal. The seat formed in the clamp ring includes at least one convex wafer engaging surface for engaging and holding down the periphery of the wafer.

This configuration has the advantage that no sharp edges on the clamp ring bear onto the wafer surface. Accordingly, damage of the wafer's surface is minimized.

Preferably, the convex wafer engaging surface is defined by at least three rollers which are rotationally supported by the clamp ring. A particular advantage of these rollers is that they are able to rotate as the clamp ring holds the periphery of the wafer onto the pedestal.

Typically, each roller is in the form of a sphere located in a pocket formed in the body of the clamp ring. A portion of each sphere protrudes beyond the seat so that the surface of the sphere contacts the wafer's surface. This keeps the wafer's surface and any sharp edges on the seat apart, thereby reducing damage of the wafer's surface by the seat.

The spheres are able to rotate in the pockets and therefore roll on the surface of the wafer. This further reduces the chances of the wafer's being damaged by the clamp ring.

These advantages and further details of the present invention will no doubt become apparent to those skilled in the art after having read the following detailed description of the preferred embodiment which is illustrated in the drawings.

DESCRIPTION OF PREFERRED EMBODIMENTS

Figure 1:
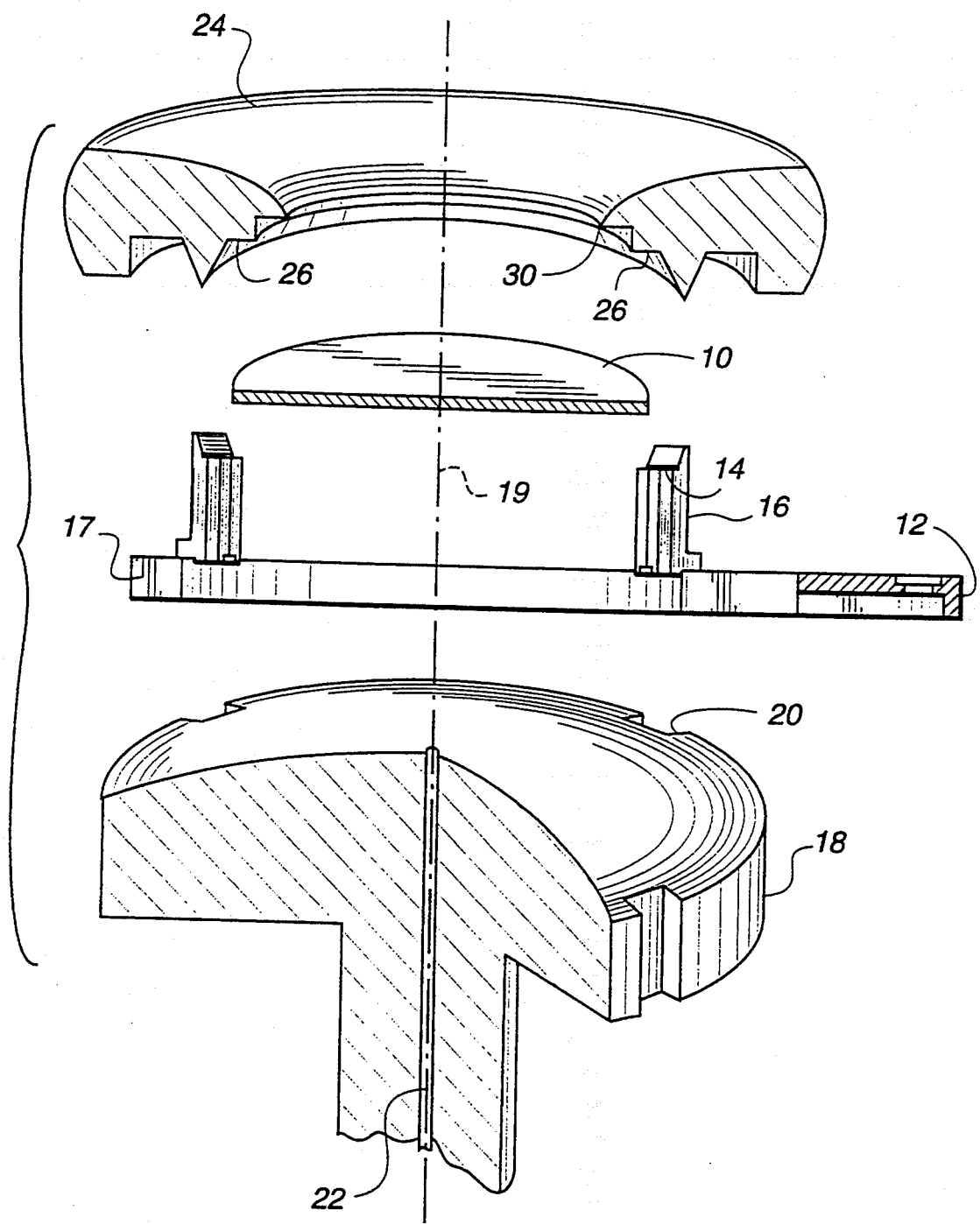
FIG. 1 is a partially sectioned, exploded view of some of the internal components of a semiconductor wafer processing thermal reactor of the prior art.
Figure 2:
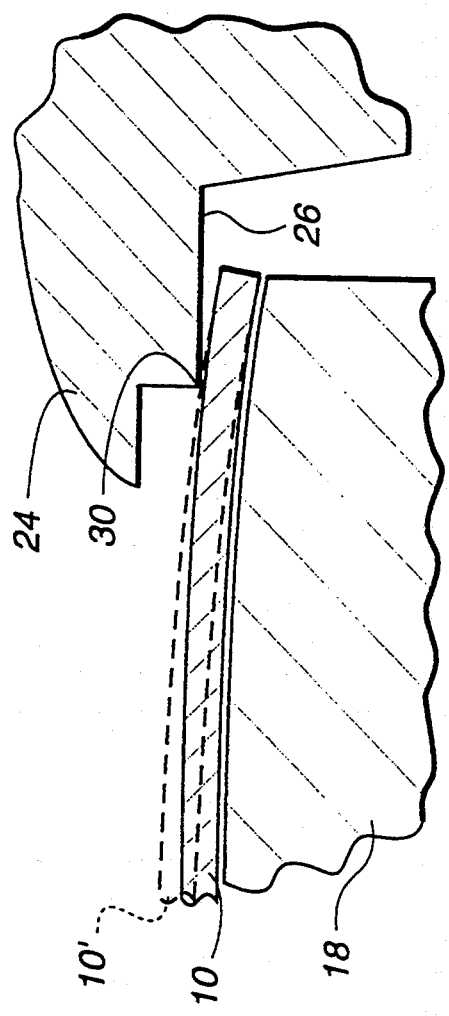
FIG. 2 is a detail of the clamp ring in FIG. 1 showing how the ring engages the wafer's surface.
Figure 3:
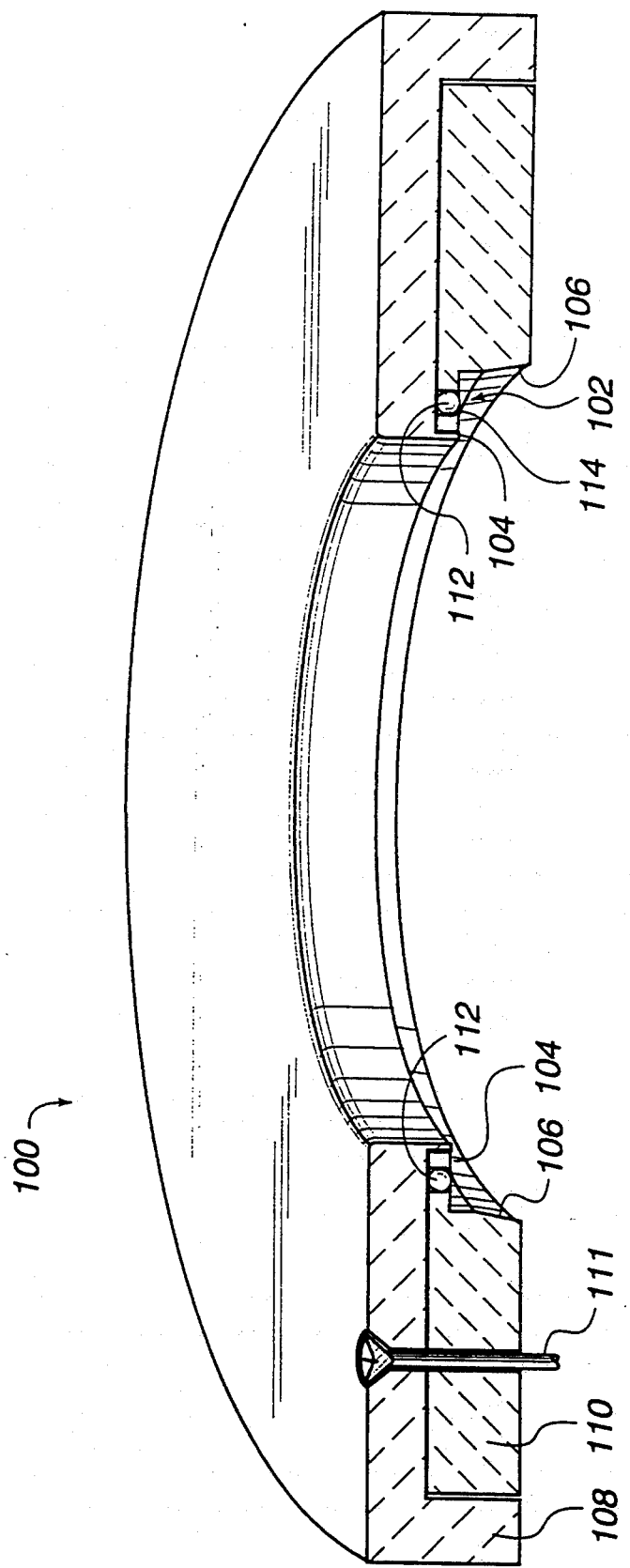
FIG. 3 is a cross section through a pictorial view of the clamp ring of the invention.
Figure 4:
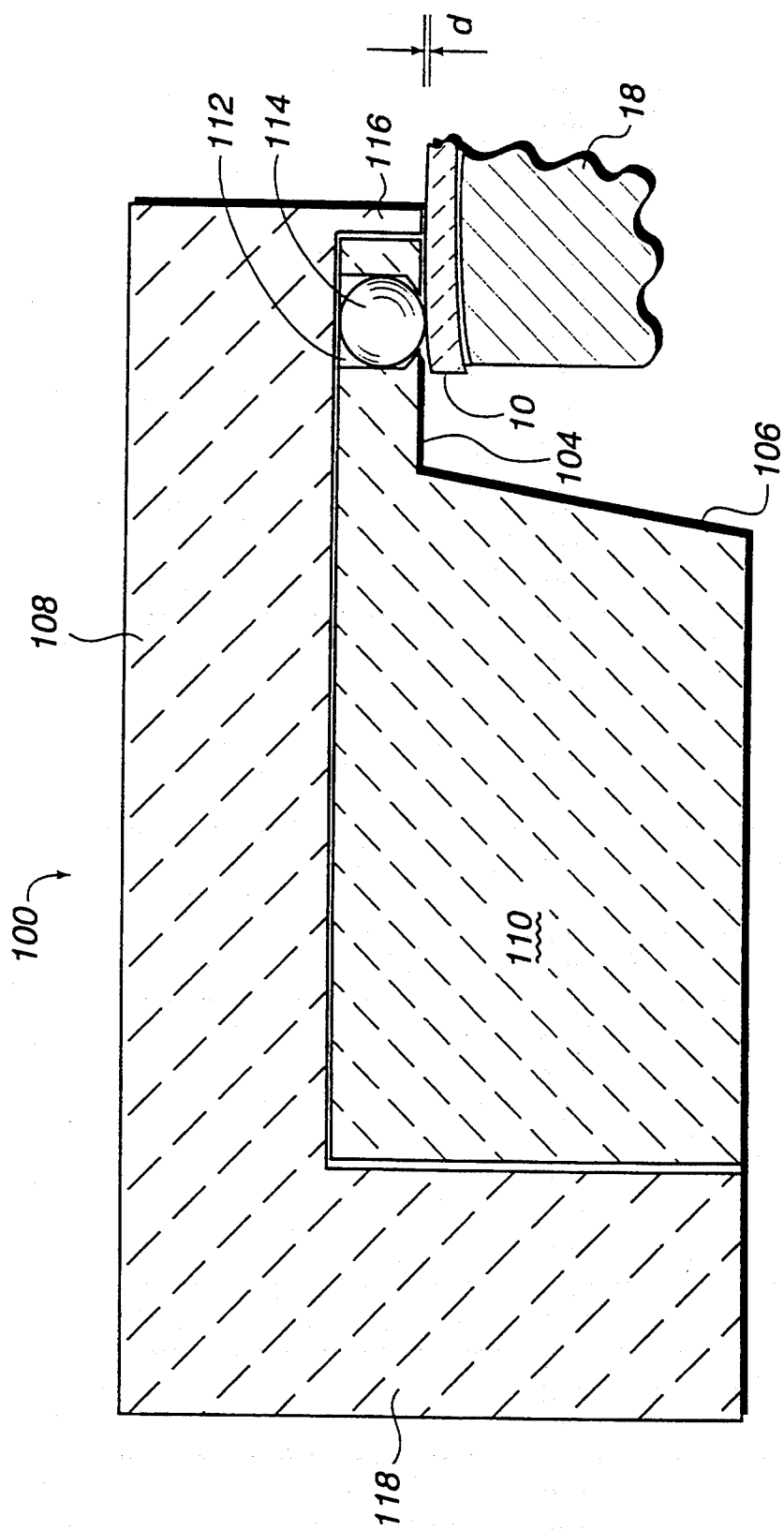
FIG. 4 is a detailed cross section through the clamp ring of the invention illustrating how it holds a wafer down onto a domed heater pedestal.

The clamp ring of the invention, which is for use in processing reactor, such plasma reactor is illustrated in both FIGS. 3 and 4. FIG. 3 shows the clamp ring in isolation and FIG. 4 shows the clamp ring holding a wafer 10 down onto a domed pedestal 18. In both these figures the clamp ring is shown schematically with some features exaggerated for ease of illustration.

The clamp ring, generally indicated as 100, is constituted by a toroidal (doughnut-shaped) body with an annular, wafer receiving seat 102 formed in its operational underside. The seat 102 is step-shaped and includes a generally horizonal roof 104, which overlaps the wafer, and a sidewall 106. The sidewall 106 is angled, typically by about 10°, back from the vertical. This angled sidewall 106, in addition to defining the outer edge of the wafer receiving seat 102, also serves to ensure that the wafer is received correctly in the seat 102 as the clamp ring 100 moves down towards the pedestal.

The body of the clamp ring 100 is of a two-part construction and includes an upper cap 108 preferably formed of quartz and a lower wafer engaging ring 110 preferably formed of alumina ceramic. The cap 108 is held down onto the engaging ring 110 by means of four screws 111 (of which only one is shown). These screws 111 pass through holes in the cap 108 and the engaging ring 110 and are screwed down into mounts (not shown) for the clamp ring. The mounts in turn, operate to support the clamp ring inside the reactor.

A ring of pockets 112, each configured to hold a sphere 114, is formed in the roof 104 of the seat 102 of the clamp ring 100. Each pocket 112 is in the form of a circular hole, of a diameter slightly larger than the sphere 114 it holds, formed into the roof 104 from above. Furthermore, each pocket 112 is open at the top (at the interface between the cap 108 and the engaging ring 110) with an opening large enough to receive the sphere. As is illustrated, each pocket also opens downwards into the space below the roof 104. At the point where the pocket 112 opens downwards, its opening is, however, restricted to be smaller than the diameter of the sphere, but large enough to allow the sphere to protrude beyond the face of the roof 104. Accordingly, the pocket holds each sphere so that it protrudes into the processing chamber.

Furthermore, although not directly evident from the drawings, it should be noted that the thickness of the roof 104 is slightly less than the diameter of the sphere and that each pocket is configured so that a sphere, held in it, is able to move slightly up and down in the pocket. This range of motion is, however, not enough for the sphere to move entirely back into the pocket and, accordingly, it always protrudes beyond the roof 104.

Typically the spheres are about 1.6 mm (0.0625 inches) in diameter and are of the kind commercially used in ceramic ball bearings. Preferably they are made from an abrasion resistant material such as silicon carbide (SiC), alumina ceramic ($Al_2O_3$), quartz ($SiO_2$) or silicon nitride ($Si_3N_4$). These materials are chosen, not only because they are abrasion resistant but also because they are relatively stable in the chemically aggressive environment of the processing chamber. In this illustrated example, the clamp ring, which is suitable for holding down an 200 mm wafer, typically has 32 spheres arranged along the circular wafer overlapping portion. In principle, however, any number of spheres greater than two could be used.

The operation of the clamp ring 100 is illustrated in FIG. 4. As the clamp ring 100 moves down to receive the wafer 10 in the seat 102, the wafer 10 is engaged at its peripheral zone by the spheres 114. The spheres 114 engage the surface of the wafer about 1.5 mm (0.060 inches) from the perimeter. This is approximately the same point as the prior art clamp ring 24 would contact the wafer's surface.

As described above, the spheres 114 are free to move slightly up and down within the pockets 112. This means that the spheres are briefly prevented from moving downward at the time of contact with the wafer and they move relatively up in the pockets 112 until the upper cap 108, of the clamp ring 100, bears down on them. Once this happens, the spheres are forced down along with the clamp ring 100 as it moves further down. This, in turn, causes the wafer 10 to bend to conform to the dome of the pedestal. As this occurs, the spheres 114, which are bearing on the wafer, roll on the wafer's surface instead of being dragged across it. Although the spheres only roll about 0.05 to 0.08 mm (0.002 to 0.003 inches) along the surface of the wafer, this is sufficient to prevent them from sliding and scraping the wafer's surface.

Similarly, when gas is injected between the domed pedestal 18 and the wafer 10 during processing, to cause the wafer to flex to a position 10' (indicated in broken lines), the spheres also roll. Once again this prevents scraping of the wafer's surface.

FIG. 4 also illustrates further details of the clamp ring. As can be seen, the cap 108 includes inner and outer lips 116, 118 which overhang the engaging ring 110. One of the reasons for this configuration is that, in some cases, the engaging ring 110 is made from alumina ceramic which may form aluminum fluoride (AlF$_3$) particles during etching processes which use fluorine. These particles are undesirable from a contamination point of view. On the other hand, quartz (SiO$_2$), when etched in fluorine, forms particle free silicon fluoride (SiF$_4$)and carbon monoxide (CO) or carbon dioxide (CO$_2$)gases. The relatively non-contaminating quartz lips therefore act to shield the lower portion of the clamp ring from processing chemicals.

As shown, the inner lip 116 is about 1 mm (0.040 inches) thick and the outer lip 118 is 6.35 mm (0.25 inches) thick. Also, in the illustrated embodiment of the invention, the outer lip 118 has a slightly larger inner diameter than the outer diameter of the engaging ring 110, because quartz and alumina have different coefficients of thermal expansion. As alumina expands more than quartz, the spacing between the quartz and alumina is necessary to prevent the outwardly expanding, ceramic, engaging ring 110 from bearing against the outer lip 118.

It is important that the capping portion 108 is rigid enough to minimize its deflection under the forces generated as the clamp ring 100 bears down on the wafer 10 and the pedestal 18. As is evident, this deflection must be less than the space d between the upper surface of the wafer 10 and the horizontal face of the horizontal roof 104 of the seat 102. If the deflection were greater than d, the roof 104 of the seat would contact the wafer's surface and the benefits of the rolling spheres would be lost. Typically this requirement is met if the capping portion, when made of quartz, is about 6.35 mm (0.25 inches) thick. Furthermore, the dimension d should preferably be kept to a minimum without being so small that the wafer contacts the inner edge of the roof 104 as it flexes. For the clamp ring illustrated above this can be achieved if d is about 25 $\mu$m (0.001 inches).

This invention has, as shown above, the advantage that the wafer's surface is contacted by a convex surface. As shown, convex surfaces are provided by rolling spheres, but they could also be provided by cylindrical rollers, or fixed convex protrusions. The effect of the convex surface is that the wafer's surface remains tangential to the sphere's surface at the point of contact. In addition, if used, a roller is able to roll along the wafer's surface as the wafer bends and flexes. This reduces the damaging scraping of the wafer's surface and the resultant particle generation. This benefit can also be achieved if cylindrical rollers are used in the place of the spheres.

Another advantage is that the amount of heat transferred to the wafer from the clamp ring is substantially reduced. This is because the heat transfer is proportional to the contact area and the contact area has been reduced to a point at each sphere. Accordingly, the clamp ring does not heat the wafer's edge and better control of the wafer temperature can be achieved. This results in a more uniform temperature profile across the wafer and, accordingly, a more reliable processing operation.

Although the present invention has been described above in terms of a specific embodiment, it is anticipated that alterations and modifications thereof will no doubt become apparent to those skilled in the art. For example the engaging ring 110 of the clamp ring 102 could be made of silicon nitride instead of alumina. Also, the pedestal could be used for heating as well as cooling. Further, the precise shape of the pedestal is not critical and it may even be flat for this invention, and the wafer need not be a semiconductor wafer nor circular in shape. It could be a substrate of another material type and/or be non-circular in shape. Similarly, the principles of the invention could be applied to processing operations other than the described semiconductor wafer plasma etch process. It is therefore intended that the following claims be interpreted as covering all such alterations and modifications as fall within the true spirit and scope of the invention.

What is claimed is:

1. A clamp for use in a reactor for processing a substrate, the reactor including a pedestal for supporting the substrate, the clamp comprising a rigid body including a seat formed therein, the seat having at least one convex seat surface for engaging and holding a peripheral portion of the substrate against the pedestal.

2. A clamp as recited in claim 1, wherein the convex inner seat surface is defined by at least one rolling surface.

3. A clamp as recited in claim 2, wherein each rolling surface is defined by a sphere rotationally supported by the body of the clamp.

4. A clamp as recited in claim 3, wherein each sphere is supported in a pocket formed in the body of the clamp to define the convex seat surface.

5. A clamp as recited in claim 4, wherein the body of the clamp includes an outer peripheral section having an inner aperture for exposing a major portion of the substrate when the peripheral portion of the substrate is engaged by the seat surface.

6. A clamp as recited in claim 5, wherein the inner aperture is generally circular and the body of the clamp supports at least three spheres.

7. A clamp as recited in claim 1 wherein the seat surface is convex on at least two sides of a point of contact with the substrate when the substrate is engaged and held against the domed pedestal.

8. A clamp as recited in claim 3, wherein the rigid body further includes a first, engaging portion including the seat, and a second, capping portion arranged, in use, to cover at least a portion of the engaging portion.

9. A clamp as recited in claim 8, wherein the engaging portion and the capping portion are made of different materials.

10. A clamp as recited in claim 8, the capping portion is made of quartz and the engaging portion is made of alumina.

11. A clamp as recited in claim 8, wherein each sphere is supported, in a pocket formed in the engaging portion, to protrude beyond the body of the engaging portion and thereby define the convex seat surface.

12. A clamp as recited in claim 11, wherein each pocket is dimensioned to receive a sphere so that it is able to move relatively into and out of the pocket in a direction parallel to a direction in which the substrate is held against the pedestal.

13. A clamp as recited in claim 12, wherein the rigid body further includes a stop which, in operation, prevents the sphere from moving entirely into the body of the clamp, whereby at least a portion of the surface of the sphere is kept protruding beyond the body of the engaging portion.

14. A clamp as recited in claim 13, wherein the capping portion includes the stop.

15. A clamp for holding a substrate against a pedestal during processing of said substrate, the clamp comprising:
 an annular ring having a shape generally conforming to an outer periphery of said substrate and movable relative to said pedestal for clamping said substrate against said pedestal:
 a plurality of bearing surfaces attached to said ring for contacting said outer periphery of said substrate, said bearing surfaces being convex on at least two sides about respective contacts with said substrate.

16. A clamp as recited in claim 15, further comprising rotational members held in said annular ring and respectively including said bearing surfaces.

17. A clamp as recited in claim 16, wherein said rotational members are spherical.

18. A clamp as recited in claim 16, wherein said annular ring includes:
 a first annular portion through which said rotational members protrude on a first side; and
 a second annular portion attached to a second side of said first annular portion.

19. A clamp as recited in claim 18, wherein said first annular portion includes apertures, extending from said first side to said second side thereof, in which said rotational members are held.

20. A clamp as recited in claim 18, wherein said first and second annular portions comprise first and second materials respectively and said second annular portion has a inner annular lip extending radially inwardly of said first annular portion and substantially toward said first side of said first annular portion.

21. A clamp as recited in claim 20, wherein said first material comprises alumina and said second material comprises quartz.

* * * * *